United States Patent [19]

Hartig et al.

[11] Patent Number: 5,021,139

[45] Date of Patent: Jun. 4, 1991

[54] CATHODE SPUTTERING APPARATUS

[75] Inventors: Klaus Hartig, Ronneburg; Reiner Seiler, Hanau, both of Fed. Rep. of Germany

[73] Assignee: Leybold Aktiengesellschaft, Fed. Rep. of Germany

[21] Appl. No.: 506,939

[22] Filed: Apr. 10, 1990

[30] Foreign Application Priority Data

Dec. 18, 1989 [DE] Fed. Rep. of Germany ....... 3937558

[51] Int. Cl.$^5$ ..................... C23C 14/34; C23C 14/35
[52] U.S. Cl. ............................ 204/298.09; 204/298.19
[58] Field of Search ............... 204/298.09, 298.19, 204/192.12

[56] References Cited

U.S. PATENT DOCUMENTS 3,718,572  2/1973  Robison et al. ................. 204/298.09
4,855,033  8/1989  Hurwitt ........................... 204/298.09

FOREIGN PATENT DOCUMENTS 63-312976 12/1988  Japan ............................. 204/298.09
2143255  2/1985  United Kingdom ........... 204/298.19
265764  3/1989  United Kingdom ........... 204/298.19

Primary Examiner—Aaron Weisstuch
Attorney, Agent, or Firm—Hill, Van Santen, Steadman & Simpson

[57] ABSTRACT

In a high-rate sputtering apparatus including an anode and a cathode, the cathode having an upper sputtering surface upon which is a material to be sputtered onto a substrate, an improved cooling system. The cooling system includes a carrier plate in supporting contact with the cathode and having a lateral surface in which is formed a channel groove. Coolant tubes having outside walls in selective contact with the inside walls of the channel groove and with the lower, contact surface of the cathode are provided, with the coolant tubes further having cross-sectional profiles corresponding to those of the channel grooves. The coolant tubes may also include a plurality of longitudinally extending beads formed in the outside walls to facilitate expansion.

12 Claims, 1 Drawing Sheet

CATHODE SPUTTERING APPARATUS

TECHNICAL FIELD

This invention is related to a cathode sputtering apparatus, and more particularly to a cathode sputtering apparatus having a high sputtering rate and including a cathode having a surface upon which is deposited the material to be sputtered onto a substrate, a magnet assembly for producing a loop-shaped discharge region formed by magnetic field lines emanating from and returning to the sputtering surface, an anode disposed outside the discharge region, and a carrier plate having a lateral surface, facing toward the cathode, in which is formed at least one channel groove for coolant.

BACKGROUND OF THE INVENTION

Traditional sputtering apparatus include structure for either directly cooling the target or cathode, or cooling the cathode by attaching it to a cooled carrier plate. The cathode and carrier plate are joined together so that heat may be transmitted from the cathode to the carrier plate, in which case these components are either screwed, clamped, or welded together. In one known device, contact between the carrier plate and the cathode is achieved by providing the carrier plate as an elastic member that is pressed into contact with the cathode by the pressure of a coolant flowing through the plate. In other known devices, the cathode and carrier plate are tightly joined to one another by soldering or welding, and the coolant channel is formed with a thin wall at the cathode side, which may be pressed into contact with the cathode surface by coolant pressure.

German Patent No. 24 17 288 discloses a cathode sputtering apparatus having a planar cathode surface facing toward a substrate to be sputtered. The substrate is disposed close to the discharge region of the cathode, and can be moved in a plane parallel to the cathode surface. For this purpose, a magnet assembly generating a magnetic field is arranged at a side of the cathode facing away from the planar sputtering surface. A cooling plate penetrated by coolant channels is mounted so as to press firmly against a very rigid carrier plate. The carrier plate is in turn tightly screwed to the cathode. The coolant channels in the cooling plate are provided as grooves that are incised into the cooling plate at a side facing toward the cathode. The grooves are covered by a second carrier plate.

A particular disadvantage of the above described apparatus is that the cooling channels are frequently inadequately sealed. Another disadvantage is inadequate contact between the carrier plate and the cathode, due to the fact that the cathode is not metallically bonded to the carrier plate.

SUMMARY OF THE INVENTION

It is therefore an object of the present invention to provide operationally reliable and comparatively rapid heat elimination in sputtering apparatus, by providing effective thermal contact between the coolant carrying member and the cathode to be cooled.

It is a further object of the invention to eliminate special seals (e.g. round cord rings) in such apparatus.

These and other objects are inventively achieved by providing, in the cooling channels of the sputtering apparatus, coolant tubes, the cross-sectional profiles of which correspond to the cross-sectional profiles of the cooling channels, so that the coolant tubes have their outside walls in contact with the inside surfaces of the cooling channels and/or with the outside surface of the cathode.

A carrier plate is pressed against the cathode, and has a rectilinearly meandering configuration in cross section, and the channel grooves have a generally rectangular cross-sectional profile, and are defined by a pair of downwardly extending side walls joined by a laterally extending end wall. The cathode is generally planar, and the side walls extend perpendicular to the cathode, while the end wall extends generally parallel to the cathode.

The coolant tubes inserted into the channel grooves are preferably also rectangular in cross section, and moreover are seamless.

In an alternative embodiment, the coolant tubes may have a generally rectangular cross-sectional profile, but are formed from a band of material formed on a U-shaped profile stay, and are joined at opposite ends by crimping, welding, or soldering.

In order to facilitate a defined, controlled expansion of the coolant tubes, the walls of the tubes may be provided with longitudinal beads or folds.

Other objects and advantages of the present invention will become apparent upon reference to the accompanying description when taken in conjunction with the following drawings.

DETAILED DESCRIPTION OF THE PREFERRED EMBODIMENT

Figure 1:
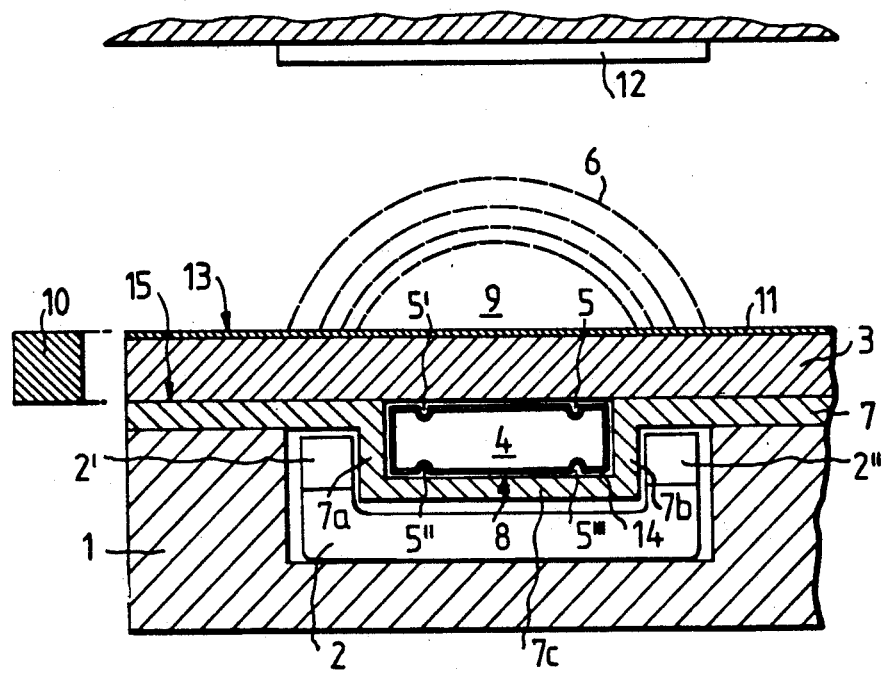
FIG. 1 is a sectional view, partly broken away, of a cathode sputtering apparatus embodying the present invention.
Figure 2:
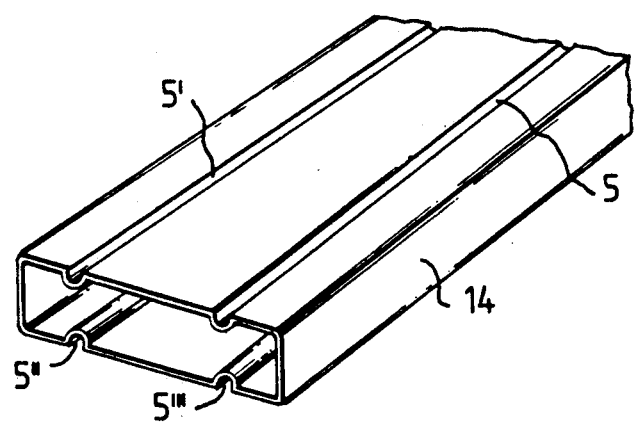
FIG. 2 is a perspective view of one embodiment of a coolant tube that may be used with the apparatus of FIG. 1.

The cathode sputtering apparatus of FIG. 1 includes a planar cathode 3 having a cathode surface 13, upon which a material 11 is deposited to be sputtered onto a substrate 12. A magnet assembly 2, 2', 2" generates a magnetic field whose field lines 6 emanate from the cathode surface 13, proceed arcuately over a discharge region 9, and subsequently return to the cathode surface 13. The magnetic assembly 2, 2', 2" thus generates a loop-shaped discharge region. An anode 10 placed around the cathode 3 generates an electrical accelerating field for electrically charge particles together with the cathode 3. The anode 10 should be spaced from the cathode outside the discharge region.

The cathode 3 is firmly attached to a carrier plate 7, for example by screws. Channel grooves 8 are incised into the carrier plate 7, for example by milling. The channel grooves 8 are formed by a pair of legs 7a, 7b extending generally perpendicular to the cathode 3, and an end-wall 7c extending generally parallel to the cathode 3. The exterior surface of the channel grooves 8 form substantially rib-like sections which are overlapped by a U-shaped magnetic yoke 2 whose legs 2', 2" are disposed adjacent the legs 7a, 7b of the carrier plate 7. The magnetic yoke 2, is in turn held by a cathode base member 1 that is also firmly attached to the carrier plate 7 or to the cathode 3.

Coolant tubes 14 having a generally rectangular cross section carry coolant 4, and are inserted into the channel grooves 8. The coolant tubes 14 are dimensioned such that three of their outside surfaces press almost directly against the inside surfaces of the channels 8, while the remaining outside surface presses against the inside surface 15 of the cathode 3.

Since the coolant 4 is supplied to the coolant tubes 14 at comparatively high pressure during operation of the sputtering apparatus, the component material and dimensions of the coolant tubes 14 are chosen so that the tubes 14 can expand slightly. This expansion permits the outside surfaces of the coolant tubes 14 to press flush against the inside walls of the channel grooves 8 and against the surface 15 of the cathode 3. A controlled, uniform expansion of the cooling tubes 14 is facilitated by providing the tubes 14 with a plurality of beads or folds, here shown as beads 5, 5', 5'', 5'''. These beads extend longitudinally of the coolant tubes 14, and flatten correspondingly with pressurization of the coolant tubes.

The coolant tubes 14 should be fabricated from a material that is especially corrosion resistant, and particularly resistant to the specific coolant to be used. Preferably, the material should also be chosen to have relatively high durability and resiliency, to reduce the chances of the coolant tubes 14 bursting during operation of the sputtering apparatus. Selection of such material thus significantly increases the operating reliability of the cathode sputtering apparatus.

Although the present invention has been described with reference to a specific embodiment, those of skill in the art will recognize that changes may be made thereto without department from the scope and spirit of the invention as set forth in the appended claims.

We claim as our invention:

1. A high-rate cathode sputtering apparatus comprising the following:
   a cathode having an outer, sputtering surface adapted to receive material to be sputtered onto a substrate;
   magnet means for producing a loop-shaped discharge region formed by magnetic field lines emanating from and returning to said sputtering surface;
   an anode disposed outside said discharge region;
   a carrier plate having a lateral surface, facing toward said cathode, in which is formed a channel groove having inside walls; and
   a coolant tube disposed in said channel groove and having outside walls in contact with said inside walls of said channel groove and with an inner, contact surface of said cathode;
   wherein said channel groove and said coolant tube have corresponding cross-sectional profiles.

2. A sputtering apparatus according to claim 1, wherein said channel groove in said carrier plate is generally rectangular in cross-section, and is defined by a pair of downwardly-extending side walls joined by a laterally-extending end wall.

3. A sputtering apparatus according to claim 2, wherein said cathode is generally planar, and said channel groove end wall extends generally parallel to said cathode.

4. A sputtering apparatus according to claim 3, wherein said coolant tube is provided with a plurality of longitudinally extending beads.

5. A sputtering apparatus according to claim 3, wherein said coolant tube is seamless.

6. A sputtering apparatus according to claim 3, wherein said coolant tube is formed from a band of material that has been joined at opposite longitudinal edges thereof by a method chosen from a group consisting of crimping, welding, or soldering.

7. In a high-rate sputtering apparatus including an anode and a cathode, said cathode having an outer, sputtering surface adapted to receive material to be sputtered onto a substrate, a cooling system comprising the following:
   a carrier plate in supporting contact with said cathode and in which is formed a channel groove having inside walls; and
   a coolant tube having outside walls in contact with said inside walls of said channel groove and with an inner, contact surface of said cathode;
   wherein said channel groove and said coolant tube have corresponding cross-sectional profiles.

8. A sputtering apparatus according to claim 7, wherein said channel groove is generally rectangular in cross-section, and is defined by a pair of downwardly-extending side walls joined by a laterally-extending end wall.

9. A sputtering apparatus according to claim 8, wherein said contact surface of said cathode extends generally parallel to said channel groove end wall.

10. A sputtering apparatus according to claim 9, wherein said coolant tube comprises a plurality of longitudinally-extending beads formed in said outside walls.

11. A method of cooling portions of a high-rate cathode sputtering apparatus of the type including an anode, a cathode, and a carrier plate in supporting contact with said cathode, said method comprising the following steps:
   providing a channel groove in said carrier plate adjacent to a lower, contact surface of said cathode and having at least one inside wall;
   providing an expansible coolant tube in said channel groove and having at least one outside wall; and
   causing coolant to flow through said coolant tube at a pressure sufficient to cause said coolant tube to expand such that said at least one outside wall of said coolant tube are in contact with said at least one inside wall of said channel groove and with said contact surface of said cathode.

12. A method according to claim 11, further comprising the step of providing a plurality of longitudinally-extending beads in said outside walls of said coolant tube.

* * * * *